United States Patent [19]
Telford et al.

[11] Patent Number: 5,510,297
[45] Date of Patent: Apr. 23, 1996

[54] PROCESS FOR UNIFORM DEPOSITION OF TUNGSTEN SILICIDE ON SEMICONDUCTOR WAFERS BY TREATMENT OF SUSCEPTOR HAVING ALUMINUM NITRIDE SURFACE THEREON WITH TUNGSTEN SILICIDE AFTER CLEANING OF SUSCEPTOR

[75] Inventors: Susan Telford, Cupertino, Calif.; Michio Aruga, Inba, Japan; Mei Chang, Cupertino, Calif.

[73] Assignee: Applied Materials, Inc., Santa Clara, Calif.

[21] Appl. No.: 504,294

[22] Filed: Aug. 10, 1995

Related U.S. Application Data

[63] Continuation of Ser. No. 352,265, Dec. 7, 1994, abandoned, which is a continuation of Ser. No. 83,420, Jun. 28, 1993, abandoned.

[51] Int. Cl.$^6$ .......................... H01L 21/283; C23C 16/42
[52] U.S. Cl. .................. 437/200; 437/245; 148/DIG. 6; 148/DIG. 147; 427/255.2
[58] Field of Search ................................. 437/200, 245; 148/DIG. 6, DIG. 17, DIG. 147; 118/715, 725; 437/126.1, 255.2

[56] References Cited

U.S. PATENT DOCUMENTS

| | | | |
|---|---|---|---|
| 4,684,542 | 8/1987 | Jasinski et al. | 437/245 |
| 4,692,343 | 9/1987 | Price et al. | 427/38 |
| 4,785,962 | 11/1988 | Toshima | 220/260 |
| 4,851,295 | 7/1989 | Brozs | 428/450 |
| 4,897,171 | 1/1990 | Ohmi | 204/298 |
| 4,966,869 | 10/1990 | Hillman et al. | 437/200 |
| 5,096,534 | 3/1992 | Ozias | 156/611 |
| 5,119,542 | 6/1992 | Ohmi et al. | 29/25.02 |
| 5,175,017 | 12/1992 | Kobayashi et al. | 427/8 |
| 5,180,432 | 1/1993 | Hansen | 118/697 |
| 5,203,956 | 4/1993 | Hansen | 156/643 |
| 5,207,836 | 5/1993 | Chang | 134/1 |
| 5,231,056 | 7/1993 | Sandhu | 437/200 |
| 5,273,588 | 12/1993 | Foster et al. | 118/723 E |

FOREIGN PATENT DOCUMENTS

| | | |
|---|---|---|
| 0134645 | 6/1984 | European Pat. Off. . |
| 0428733 | 4/1990 | European Pat. Off. . |
| 63-293920 | 11/1988 | Japan . |
| 63-310956 | 12/1988 | Japan . |
| 1064324 | 3/1989 | Japan . |
| 3-194948 | 8/1991 | Japan . |
| 3194948 | 8/1991 | Japan . |
| WO91/17839 | 11/1991 | WIPO . |

OTHER PUBLICATIONS

Gregory, Richard B., et al., "RBS and SIMS Characterization of Tungsten Silicide Deposited by Using Dichlorosilane and Tungsten Hexafluoride", *Surface and Interface Analysis*, vol. 14, 1989, pp. 13–17.

*Primary Examiner*—T. N. Quach
*Attorney, Agent, or Firm*—John P. Taylor

[57] ABSTRACT

Disclosed is a process for the formation of a tungsten silicide layer on an integrated circuit structure of a semiconductor wafer mounted on a susceptor in a vacuum chamber, wherein the tungsten silicide layer is applied at a temperature of at least 500° C. and the susceptor has an aluminum nitride surface. After the chamber has been cleaned with one or more fluorine-containing etchant gases, the improvement comprises depositing a layer of tungsten silicide on the surface of the susceptor prior to an initial deposition of tungsten silicide on a wafer mounted on the susceptor after cleaning with the fluorine-containing etchant gases.

21 Claims, 1 Drawing Sheet

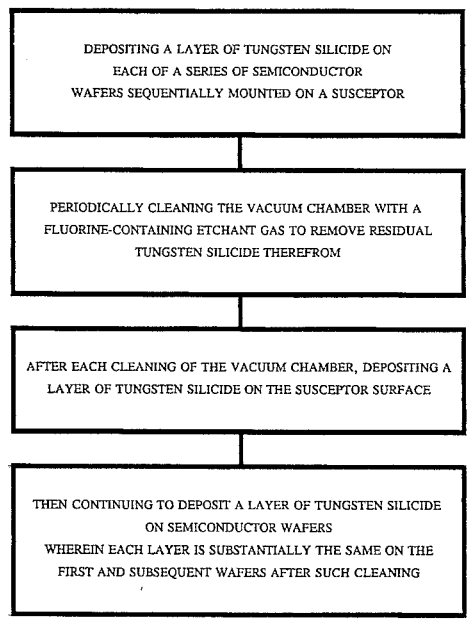

```
┌─────────────────────────────────────────────────────┐
│                                                     │
│      DEPOSITING A LAYER OF TUNGSTEN SILICIDE ON     │
│         EACH OF A SERIES OF SEMICONDUCTOR           │
│      WAFERS SEQUENTIALLY MOUNTED ON A SUSCEPTOR     │
│                                                     │
└─────────────────────────────────────────────────────┘
                          │
┌─────────────────────────────────────────────────────┐
│                                                     │
│    PERIODICALLY CLEANING THE VACUUM CHAMBER WITH A  │
│    FLUORINE-CONTAINING ETCHANT GAS TO REMOVE RESIDUAL│
│           TUNGSTEN SILICIDE THEREFROM               │
│                                                     │
└─────────────────────────────────────────────────────┘
                          │
┌─────────────────────────────────────────────────────┐
│                                                     │
│  AFTER EACH CLEANING OF THE VACUUM CHAMBER, DEPOSITING A │
│   LAYER OF TUNGSTEN SILICIDE ON THE SUSCEPTOR SURFACE │
│                                                     │
└─────────────────────────────────────────────────────┘
                          │
┌─────────────────────────────────────────────────────┐
│                                                     │
│  THEN CONTINUING TO DEPOSIT A LAYER OF TUNGSTEN SILICIDE │
│               ON SEMICONDUCTOR WAFERS               │
│   WHEREIN EACH LAYER IS SUBSTANTIALLY THE SAME ON THE │
│    FIRST AND SUBSEQUENT WAFERS AFTER SUCH CLEANING  │
│                                                     │
└─────────────────────────────────────────────────────┘
```

PROCESS FOR UNIFORM DEPOSITION OF TUNGSTEN SILICIDE ON SEMICONDUCTOR WAFERS BY TREATMENT OF SUSCEPTOR HAVING ALUMINUM NITRIDE SURFACE THEREON WITH TUNGSTEN SILICIDE AFTER CLEANING OF SUSCEPTOR

This application is a File Wrapper Continuation Application of U.S. patent application Ser. No. 08/352,265, filed Dec. 7, 1994, abandoned, which is a File Wrapper Continuation Application of U.S. patent application Ser. No. 08/083,420, filed Jun. 28, 1993.

BACKGROUND OF THE INVENTION

1. Field of the Invention

This invention relates to a process for forming a tungsten silicide layer on an integrated circuit structure of a semiconductor wafer, and more particularly, it relates to the treatment of a susceptor, having an aluminum nitride surface thereon, used in forming the tungsten silicide layer on the semiconductor wafer.

2. Description of the Related Art

In the formation of integrated circuit structures on semiconductor wafers, a vacuum chamber is provided having a susceptor on which the wafer is mounted during deposition of various layers on the wafer. When a material such as tungsten silicide is deposited, the temperature for deposition can range from about 500° C. to as much as 700° C. This temperature range requires the use of a susceptor fabricated from aluminum nitride or aluminum nitride-coated graphite to withstand the higher temperatures.

However, when a material such as tungsten silicide, for example, is deposited on a number or series of wafers, the inside walls or surfaces of the vacuum chamber become coated with tungsten silicide. This coating has to be removed periodically to prevent its flaking off and contaminating the integrated circuit structure. The removal of a coating of tungsten silicide may be accomplished by the use of a fluorine-containing etchant such as $NF_3$ or $C_2F_6$ gas. Normally, the cleaning of the vacuum chamber is performed using a plasma in conjunction with the fluorine-containing etchant gases. However, after such a cleaning treatment, the initial wafer subsequently mounted on the susceptor is not adequately receptive to the deposition of a layer of tungsten silicide. Thus, the initial or first wafer treated after cleaning is of inferior quality and is rejected. This, of course, is not only a rejection or loss of the cost of the tungsten silicide layer but also is a rejection or loss of the whole integrated circuit structure created to that point. It will be seen that the loss is not insubstantial. If the vacuum chamber is cleaned, for example, after every tenth wafer treated with tungsten silicide, the number of wafers rejected can amount to ten percent.

Thus, it would be very desirable, particularly because of economics, to eliminate the inferior deposition of tungsten silicide on the first or initial wafer after such a lo cleaning of the vacuum chamber.

SUMMARY OF THE INVENTION

It is, therefore, an object of this invention to provide a process for treating a susceptor, with an aluminum nitride surface thereon, in a vacuum chamber, after the vacuum chamber has been cleaned with a fluorine-containing etchant gas, which will permit the subsequent satisfactory deposition of a tungsten silicide layer on an integrated circuit structure of a semiconductor wafer in the chamber.

The invention comprises depositing a layer of tungsten silicide on aluminum nitride surfaces of a susceptor in a vacuum chamber prior to an initial deposition of tungsten silicide on a wafer mounted on the susceptor after the chamber has been cleaned with one or more fluorine-containing etchant gases, whereby subsequent deposition of a layer of tungsten silicide on an integrated circuit structure of a semiconductor wafer mounted on the susceptor in a vacuum chamber will not result in the formation of an unsatisfactory layer of tungsten silicide thereon.

BRIEF DESCRIPTION OF THE DRAWINGS

The sole drawing is a flow chart showing the process of the invention.

DETAILED DESCRIPTION OF THE INVENTION

The invention comprises the deposition of a tungsten silicide layer on a susceptor surface in a vacuum chamber after cleaning of the vacuum chamber with a fluorine-containing etchant gas. This subsequent deposition of tungsten silicide on the surface of the susceptor enables the subsequent deposition of an acceptable tungsten silicide layer on the first wafer processed after the chamber cleaning. In particular, it is important that the susceptor surface which contacts the wafer, i.e., the wafer support plate, be coated with tungsten silicide. The method or steps of the invention, which permit the satisfactory deposition of a layer of tungsten silicide on integrated circuit structures on semiconductor wafers, even after cleaning of the chamber, are illustrated in the flow sheet. The method provides uniformity or repeatability from wafer to wafer regardless of whether the vacuum chamber undergoes periodic cleaning after a certain number of wafers are processed.

The tungsten silicide layer to be deposited on the susceptor may be applied in any way that provides a coating on the susceptor. For example, the tungsten silicide layer may be applied or deposited on the susceptor surface by a CVD process wherein, for example, a mixture of $WF_6$ and $SiCl_2H_2$ gases and a carrier gas such as argon or helium is flowed into the chamber. The layer may also be applied to the susceptor surface by a plasma enhanced chemical vapor deposition (PECVD) process.

When chemical vapor deposition is used, a gaseous mixture, for example, of $WF_6$ gas; a silicon gas source such as, for example, dichlorosilane ($SiCl_2H_2$), monochlorosilane ($SiClH_3$), trichlorosilane ($SiCl_3H$), or disilane ($Si_2H_6$); and a carrier gas, such as argon or helium, may be flowed into the vacuum chamber. The flow rates may comprise a rate of about 2 to 10 standard cubic centimeters per minute (sccm) for $WF_6$, preferably 3 to 6 sccm, with a typical rate being about 4 sccm; and a flow rate of silicon-containing gas such as dichlorosilane ($SiCl_2H_2$) of about 50 to 400 sccm, with a preferred rate being in the range of 100 to 300 sccm, with a typical rate being about 150 sccm. The carrier gas in the mixture, preferably argon or helium, is flowed into the chamber at a rate of 200 to 1000 seem, preferably at a rate in the range of 300 to 700 sccm, with a typical rate being about 500 sccm. During the tungsten silicide deposition, the susceptor, i.e., the wafer support plate, should be maintained in a temperature range of about 500° C. to about 700° C., preferably from about 525° C. to about 650° C., with a typical temperature being about 550° C.

With respect to pressure during the deposition process, the vacuum chamber should be maintained at a pressure in the range of from about 0.5 Torr to about 10 Torr, with a preferred range being from about 1 Torr to about 5 Torr, with a typical pressure being about 3 Torr.

The thickness of the tungsten silicide layer deposited on the susceptor should be in an amount sufficient to enable acceptable subsequent deposition of a tungsten silicide layer on the first wafer processed after cleaning. It has been found that to achieve this, the thickness of the tungsten silicide layer deposited on the susceptor should range from about 800 Angstroms to about 3000 Angstroms, with a preferably thickness being in the range of from about 1000 Angstroms to about 2000 Angstroms.

When the tungsten silicide layer is applied using a plasma assisted deposition, the power utilized for the plasma is in the range of 25 to 75 watts, with a typical amount of power being about 50 watts. Further, when plasma assisted CVD is used, the above described gas mixture of $WF_6$, dichlorosilane, and carrier gas is flowed into the chamber at a rate of from about 0.5 to about 8.5 sccm for $WF_6$, with a typical rate being about 4.5 sccm; and from about 50 to about 250 sccm for $SiCl_2H_2$ (dichlorosilane), with a typical rate being about 100 sccm. A carrier gas, such as argon, is not used with a plasma to avoid sputtering the reactor walls.

A vacuum chamber suitable for use in accordance with the present invention may be any commercially available chemical vapor deposition equipment capable of being operated in accordance with the invention. Such chamber should include a susceptor on which the wafer rests in the chamber or reactor during processing.

Any and all electrodes and other equipment utilized within the process reactor may comprise process apparatus (such as graphite electrodes) protected by an aluminum nitride coating or surface thereon. Or, any and all such electrodes and other equipment within the process reactor may be fabricated from sintered aluminum nitride material. For example, the susceptor may comprise a disk-shaped aluminum nitride susceptor plate with a metallic electrode plate fixed to the back surface of the susceptor plate and an electrode cover plate mounted to the back surface of the aluminum nitride susceptor plate to cover the metallic electrode plate. Preferably, the aluminum nitride has high purity with a minimum of impurities such as yttrium. An example of equipment which may be used in the practice of the invention comprises the Precision 5000 multi-chamber deposition and etching system available from Applied Materials, Inc., Santa Clara, California. A suitable multi-chambered apparatus is described in U.S. Pat. No. 4,785,962 incorporated herein by reference.

The following examples will serve to further illustrate the invention.

EXAMPLE I

To illustrate the prior art practice of depositing tungsten silicide on a wafer directly after cleaning of the chamber, a reaction chamber utilizing equipment therein having aluminum nitride surfaces was used to deposit a series of tungsten silicide layers on integrated circuit structures on semiconductor wafers.

After processing about 25 wafers at a temperature of 550° C., the chamber surfaces were cleaned using $NF_3$ to remove buildup of tungsten silicide from the inside surfaces of the reactor. After cleaning, a wafer was mounted on an aluminum nitride susceptor, and (without precoating the susceptor) a tungsten silicide layer was deposited on the wafer using a gas mixture comprising $WF_6$ which was flowed into the chamber at 4 sccm; dichlorosilane which was flowed into the chamber at 150 sccm; and argon as a carrier gas which was flowed into the chamber at 500 sccm. The susceptor was maintained at a temperature of 550° C., and the chamber had a pressure of about 3 Torr during the deposition.

The coated wafer was removed from the chamber and examined. The tungsten silicide was found to be inferior because the resistivity of the coating was about 700 $\mu\Omega$ cm, i.e., about 100 $\mu\Omega$ cm below the desired resistivity (more tungsten-rich). Such low resistivity coatings of tungsten silicide have been found to delaminate in post processing. The tungsten silicide coating was also found to be less uniform or homogeneous in resistivity value across the wafer. I.e., the resistivity was found to vary by as much as 5% across the wafer, when a resistivity variation of not more than 3% is desirable.

EXAMPLE II

The procedure explained above in Example I was again repeated except that, in accordance with the invention, after the chamber was cleaned, as described above, and prior to placing a wafer on the susceptor, a layer of tungsten silicide was deposited on the surface of the susceptor under the same conditions as described above with respect to deposition on the wafer. Thereafter, a first wafer was placed on the coated susceptor support plate, and a tungsten silicide layer was deposited on the wafer under the same conditions as for the deposition on the wafer in Example I after the cleaning step. The coated wafer was removed and examined and found to have a uniform layer of tungsten silicide deposited thereon of about 500 Angstrom thickness. The resistivity of the resultant tungsten silicide layer was found to be about 800 $\mu\Omega$ cm, with less than a 3% variation in resistivity in the coating across the wafer. A second wafer was then mounted on the tungsten silicide coated susceptor, and tungsten silicide was deposited under the same conditions as noted with respect to the last wafer. This second wafer was then also removed and examined, and the tungsten silicide coating was found to have the same quality coating as on the previous wafer, i.e., a resistivity of about 800 $\mu\Omega$ cm, and less than a 3% variation in resistivity in the coating across the wafer. The same resistivity characteristics were also obtained on other wafers processed in accordance with the invention and having tungsten silicide coatings varying in thickness from about 500 to about 3000 Angstroms.

Similar results were obtained by modifying the process to include the use of plasma lo enhanced chemical vapor deposition of a tungsten silicide layer. In the plasma enhanced deposition, the conditions were the same as for the chemical vapor deposition except that the power was maintained at 25 watts, $WF_6$ was flowed at 4.5 sccm, and dichlorosilane was flowed in at a rate of 150 sccm, and no carrier gas was used to avoid sputtering the reactor chamber walls.

Thus, it will be seen that the described treatment of a susceptor, particularly a susceptor with an aluminum nitride surface thereon, in accordance with the invention, enables the production of integrated circuit structures on semiconductor wafers, and in particular the deposition of a layer of tungsten silicide thereon, on a reproducible basis, regardless of periodic cleaning of the chamber.

Having thus described the invention what is claimed is:

1. In a process for the formation of a tungsten silicide layer on an integrated circuit structure of a semiconductor wafer mounted on a susceptor in a vacuum chamber, after the chamber has been cleaned with one or more fluorine-containing etchant gases, the improvement comprising depositing a layer of tungsten silicide on said susceptor prior to an initial deposition of tungsten silicide on a wafer mounted on said susceptor after said cleaning with said fluorine-containing etchant gases.

2. The process of claim 1 wherein said susceptor is provided with an aluminum nitride surface thereon.

3. The process in accordance with claim 1 wherein said susceptor is maintained in a temperature range of from about 500° C. to about 700° C. during said step of depositing tungsten silicide on said susceptor.

4. The process in accordance with claim 1 wherein said susceptor is maintained at a temperature of at least about 550° C. during said deposition on said susceptor.

5. The process in accordance with claim 1 wherein said layer of tungsten silicide deposited on said susceptor is coated to a thickness in the range of from about 800 Angstroms to about 3000 Angstroms.

6. The process in accordance with claim 1 wherein said fluorine-containing etchant gas is selected from the group consisting of $NF_3$ and $C_2F_6$.

7. The process in accordance with claim 1 wherein said tungsten silicide layer is formed on said susceptor by flowing a mixture comprising $WF_6$ and $SiCl_2H_2$ gases and a carrier gas into said chamber.

8. The process in accordance with claim 7 wherein said tungsten silicide is deposited by flowing into said chamber said mixture of gases at a rate of 2 to 10 sccm for $WF_6$, 5 to 200 sccm for $SiCl_2H_2$, and 200 to 1000 sccm for said carrier gas, while said vacuum chamber is maintained at a pressure in a range of about 0.5 Torr to about 10 Torr.

9. The process in accordance with claim 1 wherein said susceptor is an aluminum nitride coated graphite susceptor.

10. The process in accordance with claim 1 wherein said susceptor is a sintered aluminum nitride susceptor.

11. The process in accordance with claim 1 wherein said step of depositing said layer of tungsten silicide on said susceptor is carried out using a plasma.

12. In a process for the formation, in a vacuum chamber, of a tungsten silicide layer on an integrated circuit structure of a semiconductor wafer mounted on a susceptor having an aluminum nitride surface, after the chamber has been cleaned with one or more fluorine-containing etchant gases, the improvement which comprises:
   (a) depositing a 200 to 3000 Angstrom thick layer of tungsten silicide on said susceptor by flowing a mixture of $WF_6$ and $SiCl_2H_2$ gases and a carrier gas into said chamber, said depositing being made prior to an initial deposition of tungsten silicide on a wafer mounted on said susceptor after cleaning with said fluorine-containing etchant gases; and
   (b) maintaining said susceptor in a temperature range of from about 500° C. to about 700° C. during said deposition.

13. The process in accordance with claim 12 wherein said depositing of said tungsten silicide layer is carried out using a plasma.

14. In an improved tungsten silicide deposition process, in a vacuum chamber, wherein a tungsten silicide layer is formed on an integrated circuit structure of a semiconductor wafer mounted on a susceptor having an aluminum nitride surface thereon, the improved process comprising:
   (a) cleaning said chamber to remove previous depositions of tungsten silicide;
   (b) maintaining said susceptor at a temperature of at least 500° C.; and
   (c) depositing on said susceptor a layer of tungsten silicide, said depositing being made prior to an initial deposition of tungsten silicide on a first wafer mounted on said susceptor after said cleaning.

15. In an improved tungsten silicide deposition process, in a vacuum chamber, wherein a tungsten silicide layer is formed on an integrated circuit structure of a semiconductor wafer mounted on a susceptor having an aluminum nitride surface thereon, the improved process comprising:
   (a) cleaning said chamber with fluorine-containing etchant gases to remove previous depositions of tungsten silicide;
   (b) maintaining said susceptor at a temperature of at least 500° C.; and
   (c) depositing on said susceptor a layer of tungsten silicide, said depositing being made prior to an initial deposition of tungsten silicide on a first wafer mounted on said susceptor after cleaning with said fluorine-containing etchant gases.

16. The process of claim 15 wherein said fluorine-containing etchant gas is selected from the group consisting of $NF_3$ and $C_2F_6$.

17. The process of claim 15 wherein said tungsten silicide layer is deposited by flowing into said chamber a mixture of gases comprising:
   a) $WF_6$, at a rate of from about 2 to about 10 sccm;
   b) dichlorosilane, at a rate of from about 5 to about 200 sccm; and
   c) a carrier gas, at a rate of from about 200 to about 600 sccm.

18. The process of claim 17 wherein said carrier gas is selected from the group consisting of argon and helium.

19. The process of claim 15 wherein said susceptor is maintained in a temperature range of from about 550° C. to about 700° C.

20. The method in accordance with claim 15 wherein said tungsten silicide layer deposited on said susceptor has a thickness in the range of from about 800 to about 3000 Angstroms.

21. The method in accordance with claim 15 which further includes the steps of sequentially mounting a series of semiconductor wafers individually on said susceptor after depositing said tungsten silicide on said susceptor, and then depositing a layer of tungsten silicide on each of said wafers.

* * * * *